(12) United States Patent
Razavieh et al.

(10) Patent No.: US 12,170,315 B2
(45) Date of Patent: Dec. 17, 2024

(54) FIELD EFFECT TRANSISTOR WITH VERTICAL NANOWIRE IN CHANNEL REGION AND BOTTOM SPACER BETWEEN THE VERTICAL NANOWIRE AND GATE DIELECTRIC MATERIAL

(71) Applicant: GLOBALFOUNDRIES U.S. Inc., Malta, NY (US)

(72) Inventors: Ali Razavieh, Saratoga Springs, NY (US); Haiting Wang, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 347 days.

(21) Appl. No.: 17/569,897

(22) Filed: Jan. 6, 2022

(65) Prior Publication Data

US 2023/0215917 A1 Jul. 6, 2023

(51) Int. Cl.
*H01L 29/06* (2006.01)
*H01L 29/66* (2006.01)
*H01L 29/78* (2006.01)
*H01L 29/786* (2006.01)

(52) U.S. Cl.
CPC .... *H01L 29/0673* (2013.01); *H01L 29/66666* (2013.01); *H01L 29/7827* (2013.01); *H01L 29/78642* (2013.01)

(58) Field of Classification Search
CPC ........... H01L 29/0673; H01L 29/66666; H01L 29/7827; H01L 29/78642; H01L 29/1606; H01L 29/24; H01L 29/456; H01L 29/7788; H01L 29/7789; H01L 29/0847; H01L 29/42392; H01L 29/78696

USPC ........................................................ 257/213
See application file for complete search history.

(56) References Cited

U.S. PATENT DOCUMENTS

| | | | |
|---|---|---|---|
| 9,647,097 | B2 | 5/2017 | Bhuwalka et al. |
| 9,786,656 | B1 | 10/2017 | Anderson et al. |
| 10,134,915 | B2 | 11/2018 | Colinge et al. |
| 10,388,732 | B1 | 8/2019 | Frougier et al. |
| 2014/0353593 | A1* | 12/2014 | Smets ............... H01L 29/66356 257/39 |
| 2017/0317206 | A1 | 11/2017 | van Dal et al. |
| 2018/0182898 | A1 | 6/2018 | Moroz et al. |
| 2018/0269320 | A1* | 9/2018 | Chi ................... H01L 29/66795 |
| 2019/0304833 | A1* | 10/2019 | Chen ................. H01L 21/76814 |
| 2019/0386145 | A1* | 12/2019 | Ok ...................... H01L 29/7827 |

(Continued)

FOREIGN PATENT DOCUMENTS

CN 112928025 B * 11/2023 ....... H01L 29/66666

OTHER PUBLICATIONS

Jiang et al., "Schottky-barrier quantum well in two-dimensional semiconductor nanotransistors", Materials Today Physics, vol. 15, Dec. 2020, 100275, Abstract, 3 pages.

*Primary Examiner* — Mohammad M Hoque
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a device with a vertical nanowire channel region and methods of manufacture. The structure includes: a bottom source/drain region; a top source/drain region; a gate structure extending between the bottom source/drain region and the top source/drain region; and a vertical nanowire in a channel region of the gate structure.

20 Claims, 10 Drawing Sheets

(56) References Cited

U.S. PATENT DOCUMENTS

2020/0144293 A1\* 5/2020 Majhi ................... H10B 51/00
2022/0084891 A1\* 3/2022 Tomioka ............... H01L 29/417

\* cited by examiner

FIELD EFFECT TRANSISTOR WITH VERTICAL NANOWIRE IN CHANNEL REGION AND BOTTOM SPACER BETWEEN THE VERTICAL NANOWIRE AND GATE DIELECTRIC MATERIAL

BACKGROUND

The present disclosure relates to semiconductor structures and, more particularly, to a device with a vertical nanowire channel region and methods of manufacture.

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities. For example, reducing a fin diameter in finFET technologies to improve electrostatic control is not possible due to fin distortion and quantum confinement effects which start to degrade device performance. In fact, current patterning technologies are limiting scaling of channel length Lg to usually greater than 20 nm.

SUMMARY

In an aspect of the disclosure, a structure comprises: a bottom source/drain region; a top source/drain region; a gate structure extending between the bottom source/drain region and the top source/drain region; and a vertical nanowire in a channel region of the gate structure.

In an aspect of the disclosure, a structure comprises: a vertical channel region comprising a nanowire; a first doped region below the vertical channel region; a second doped region above the vertical channel region; a gate structure adjacent to the vertical channel region and extending between the first doped region and the second doped region; a first contact contacting a gate material of the gate structure, and which is isolated from the first doped region by an insulator collar; a second contact extending to the second doped region, the second contact comprising the insulator collar; and a third contact extending to the first doped region, the third contact comprising the insulator collar.

In an aspect of the disclosure, a method comprises: forming a bottom source/drain region; forming a top source/drain region; forming a gate structure extending between the bottom source/drain region and the top source/drain region; and forming a vertical nanowire in a channel region of the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device with a vertical nanowire channel region and methods of manufacture. More specifically, the present disclosure provides a field effect transistor with a vertical nanowire in the channel region. In embodiments, the vertical nanowire comprises two-dimensional (2-D) material surrounding a supporting core and, more specifically, comprising a coating of monolayer or bi-layer material. Advantageously, the vertical nanowire device improves electrostatic control and significantly reduces channel length (e.g., <5 nm).

In more specific embodiments, the device includes a vertical nanowire where the channel is formed using a 2-D material. The 2-D material in the channel region may include a dummy core (e.g., nitride pillar) for support, with a monolayer or bilayer of material coating the dummy core. In embodiments, the device (e.g., nFET and/or pFET) may have multiple dummy cores in the PFET region and the NFET region. The dummy cores may include different shapes as seen from a top view, e.g., circular, oval, rectangular, etc. In addition, the devices include a bottom spacer and a top spacer for source/drain and gate separation. A contact collar may be used for middle of the line (MOL) contacts.

The vertical nanowire devices of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical nanowire devices of the present disclosure have been adopted from integrated circuit (IC) technology. For example, the structures are built on wafers and are realized in films of material patterned by photolithographic processes on the top of a wafer. In particular, the fabrication of the vertical nanowire device uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
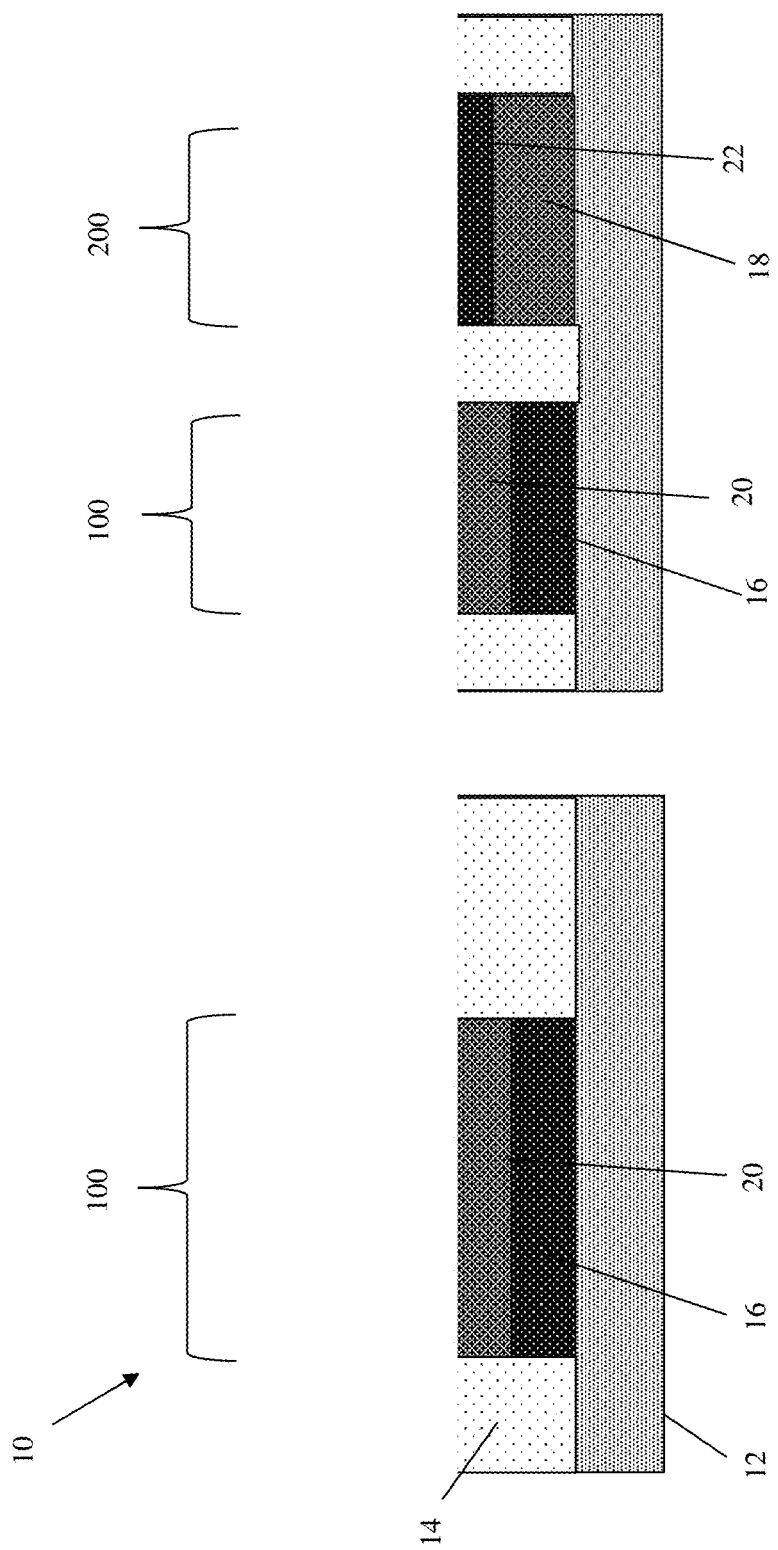
FIG. 1 shows a substrate with shallow trench isolation structures, amongst other features, and respective fabrication processes in accordance with aspects of the present disclosure.

FIG. 1 shows a substrate in two different cross-sectional views, amongst other features, and respective fabrication processes. The cross-sectional views, as with all the cross-sectional views, are provided in an x-axis and a y-axis, which intersection through a PFET region 100. The x-axis extends through the PFET region 100 and the y-axis extends through both the PFET region 100 and the NFET region 200. Although only a single gate structure is shown in the NFET region 200 and two gate structures are shown in the PFET region 100, it should be understood that more or less gate structures are contemplated by the present disclosure.

Referring more specifically to FIG. 1, the structure 10 includes a semiconductor substrate 12 with shallow trench isolation structures 14. The semiconductor substrate 12 may be a bulk substrate composed of any suitable material including, but not limited to, Si, SiGe, SiGeC, SiC, GaAs, InAs, InP, and other III/V or II/VI compound semiconductors. In embodiments, the semiconductor substrate 12 may be a p-doped substrate.

The shallow trench isolation structures 14 may be composed of an insulator material, e.g., oxide. In embodiments, the shallow trench isolation structures 14 may be formed by conventional lithography, etching and deposition methods known to those of skill in the art. For example, a resist formed over the semiconductor substrate 12 is exposed to energy (light) to form a pattern (opening). An etching process with a selective chemistry, e.g., reactive ion etching (RIE), will be used to transfer the pattern from the photoresist layer to the semiconductor substrate 12 thereby forming one or more trenches in the semiconductor substrate 12. Following the resist removal by a conventional oxygen ashing process or other known stripants, the insulator material (e.g., oxide) can be deposited by any conventional deposition processes, e.g., chemical vapor deposition (CVD) processes. Any residual insulator material on the surface of the semiconductor substrate 12 can be removed by conventional chemical mechanical polishing (CMP) processes.

Still referring to FIG. 1, wells 16, 18 and implant (doped) regions 20, 22 may formed in the semiconductor substrate 12 between the shallow trench isolation structures 14. In embodiments, the well 16 may be an N-well in the PFET region 100 and the well 18 may be a P-well in the NFET region 200. In addition, the implant region 20 (e.g., bottom source/drain regions) may be a P+ implant in the PFET region 100 and the implant region 22 (e.g., bottom source/drain region) may be an N+ implant in the NFET region 200.

The wells 16, 18 and implant regions 20, 22 may be formed by introducing a dopant by, for example, ion implantation that introduces a concentration of a different dopant in the semiconductor substrate 12. In embodiments, respective patterned implantation masks may be used to define selected areas exposed for the wells 16, 18 and implant regions 20, 22. The implantation mask used to select the exposed area for forming wells and implant regions of a first dopant type is stripped after implantation, and before the implantation mask used to form the well and implant regions of a second dopant type. Similarly, the implantation mask used to select the exposed area for forming the well and the implant regions of the second dopant type is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 18 and P+ implant region 20 are doped with p-type dopants, e.g., Boron (B), and the N-well 16 and N+ implant regions 22 are doped with n-type dopants, e.g., Arsenic (As), Phosphorus (P) and Sb, among other suitable examples. In embodiments, the implant regions 20, 22 may be more heavily doped than the wells 16, 18.

Figure 2:
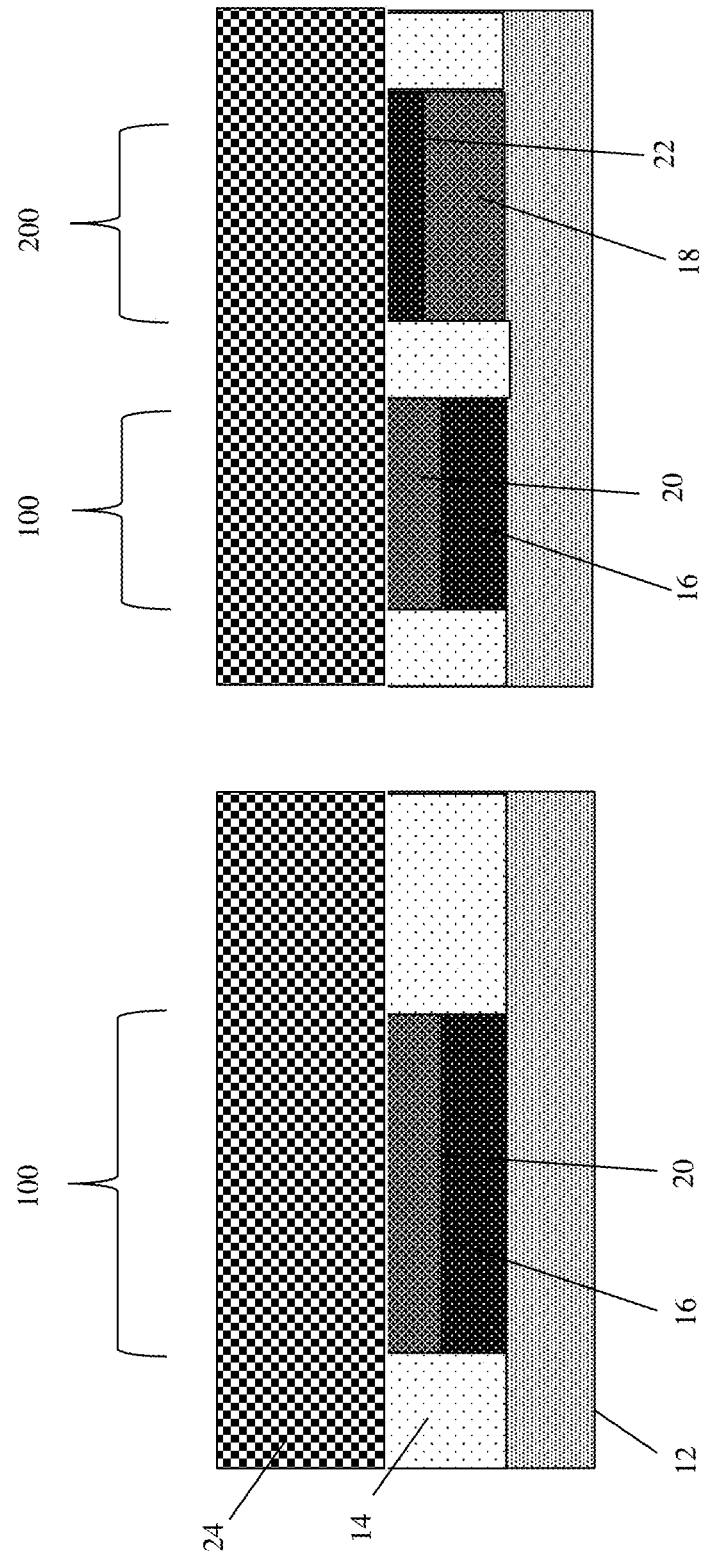
FIG. 2 shows a core material formed over a surface of the substrate, amongst other features, and respective fabrication processes in accordance with aspects of the present disclosure.

In FIG. 2, a core material 24 may be formed over a surface of the semiconductor substrate 12 and shallow trench isolation structures 14. In embodiments, the core material 24 may be a nitride material, deposited by conventional deposition methods. For example, the core material 24 may be deposited by a CVD process.

Figure 3:
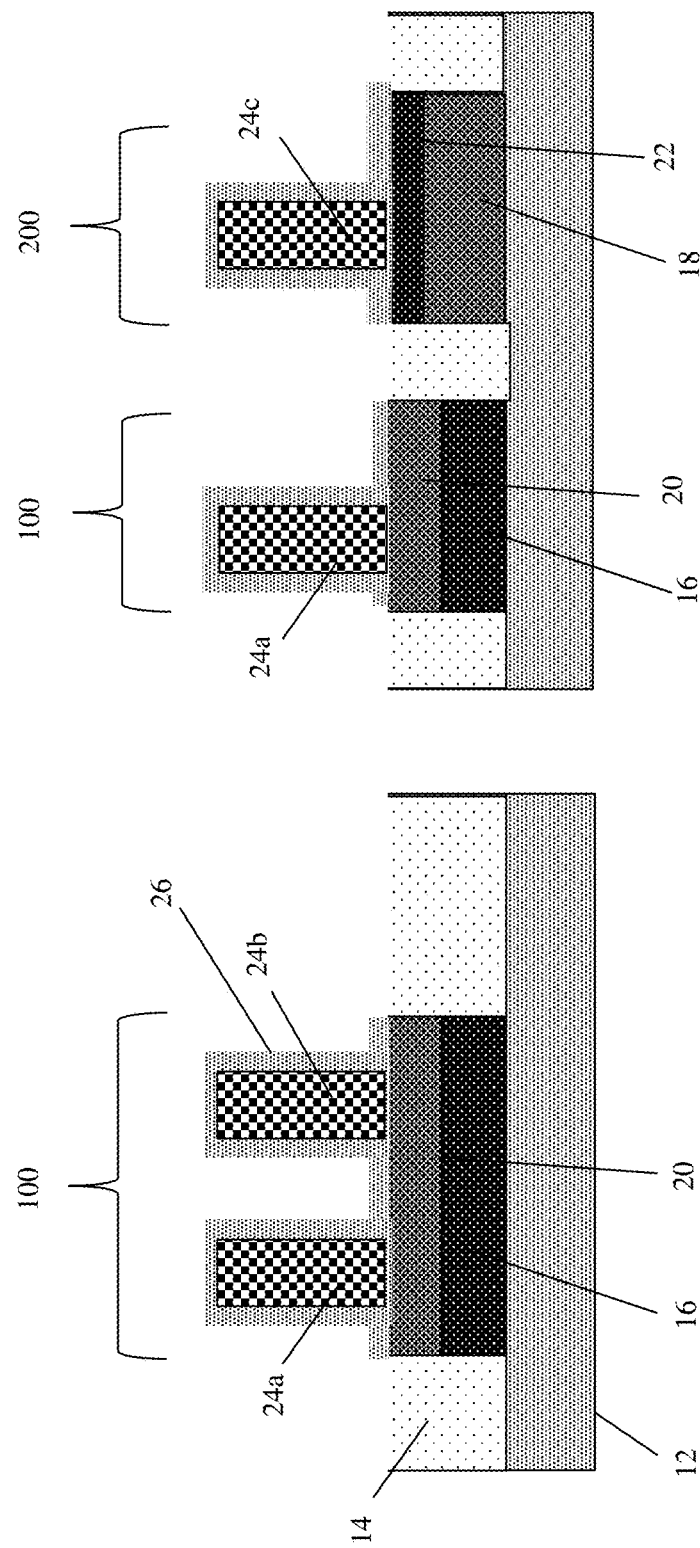
FIG. 3 shows nanowires, amongst other features, and respective fabrication processes in accordance with aspects of the present disclosure.

As shown in FIG. 3, the core material is patterned to form supporting cores or pillars 24a, 24b, 24c. In embodiments, the cores 24a, 24b may be formed on the P+ implant region 20 and the core 24c may be formed on the N+ implant region 22. In embodiments, each of the cores 24a, 24b, 24c may have a width of about 10 nm to about 30 nm; although other dimensions are contemplated herein. The cores 24a, 24b, 24c may be formed by conventional CMOS patterning processes, including sidewall image transfer (SIT) or self-aligned double patterning (SADP) as examples. The cores 24a, 24b, 24c may be patterned into different shapes as seen from a top view, e.g., circular, oval, rectangular, etc.

Still referring to FIG. 3, a nanowire material 26 coats the vertical and horizontal surfaces of the cores 24a, 24b, 24c, in addition to any active regions (e.g., P+ implant region 20 and N+ implant region 22). The nanowire material 26 may be a monolayer or bi-layer of 2-D material, e.g., $MoS_2$, $HfS_2$, $ZrS_2$, $WS_2$, $WSe_2$, SnS, graphene, etc., which forms the vertical nanowires surrounding and supported by the cores 24a, 24b, 24c. The thickness of nanowire material 26 may be about 20 Å to about 50 Å. In embodiments, the nanowire material 26 may be deposited using conformal deposition processes such as CVD or atomic layer deposition (ALD). The nanowire material 26 may be removed from the inactive regions of the device, e.g., over the shallow trench isolation structures 14 in the PFET region 100 and the NFET region 200, using conventional lithography and etching processes as already described herein.

Figure 4:
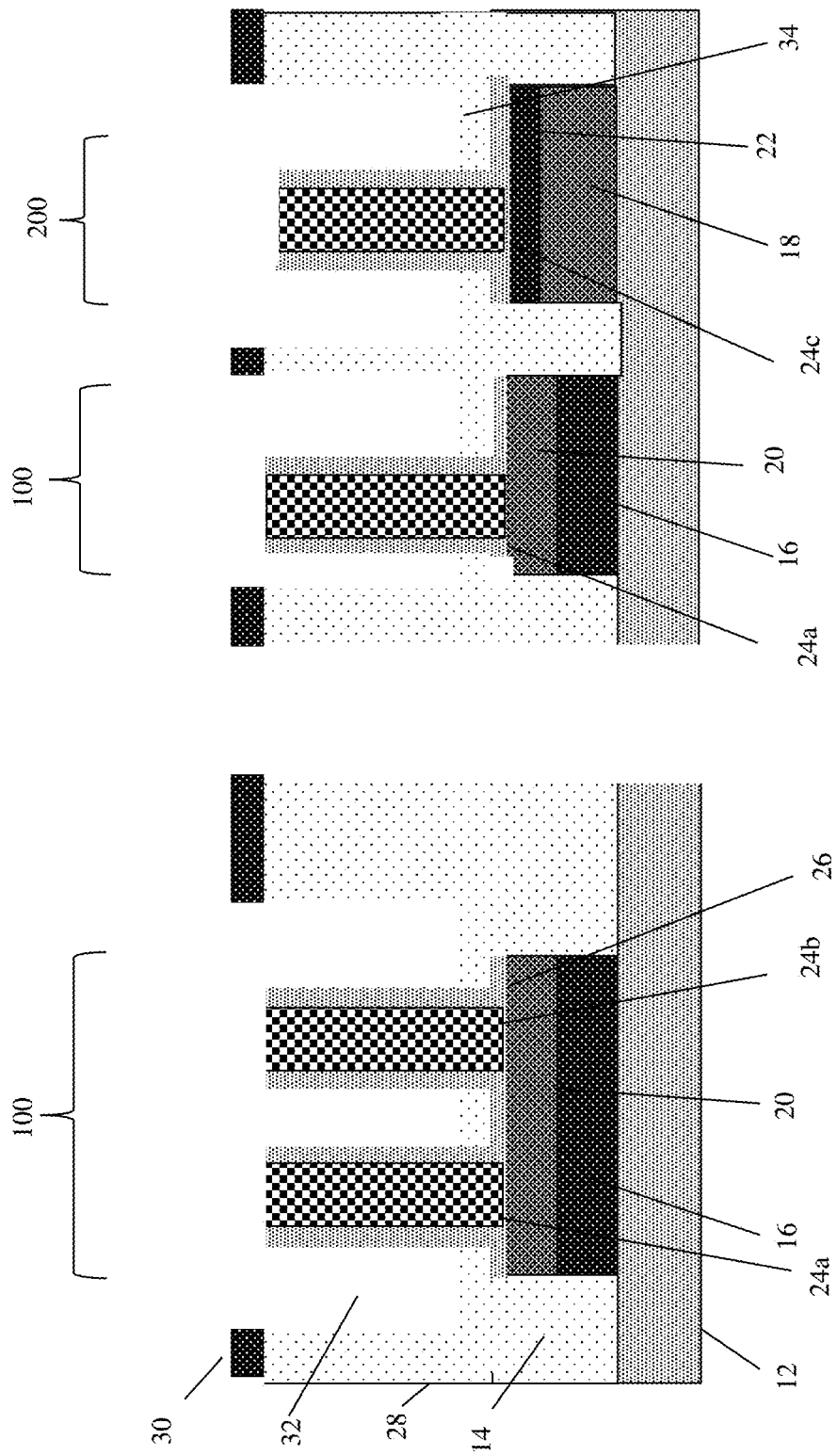
FIG. 4 shows gate trenches, amongst other features, and respective fabrication processes in accordance with aspects of the present disclosure.

In FIG. 4, an insulator material 28 may be formed over the nanowire material 26 and respective cores 24a, 24b, 24c, in addition to over the shallow trench isolation structures 14. In embodiments, the insulator material 28 may be an oxide material which is deposited by a CVD process and planarized using a chemical mechanical polishing (CMP) process. The CMP process may also remove the nanowire material 26 from a top surface of the respective cores 24a, 24b, 24c, leaving a vertical portion of the nanowire material 26 in a channel region of a subsequently formed vertical device.

A hardmask material 30, e.g., TiN, may be formed over the insulator material 28. The hardmask material 30 may be patterned to define a gate trench opening. The underlying insulator material 28 may be recessed using the pattern of the gate trench opening and cores 24a, 24b, 24c, with a selective etching process thereby forming gate trenches 32. In embodiments, insulator material remains on a bottom of the gate trenches 32 to form a bottom spacer 34. Also, the gate trenches 32 will expose the nanowire material 26 on vertical sidewalls of the cores 24a, 24b, 24c, hence allowing the vertical portions of the nanowire material 26 to be used as vertical channel regions. More specifically, the nanowire material 26 may now be in a channel region of a device, e.g., NFET device or PFET device.

Figure 5:
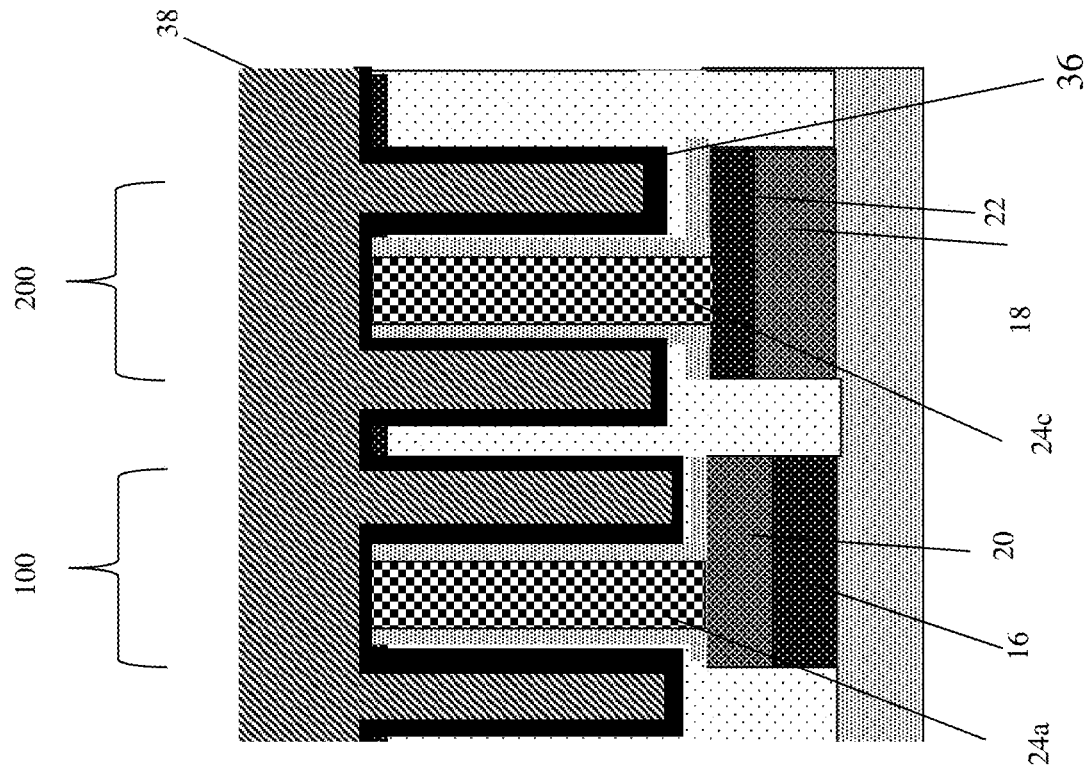
FIG. 5 shows a gate dielectric material and gate material within the gate trenches, amongst other features, and respective fabrication processes in accordance with aspects of the present disclosure.
Figure 5:
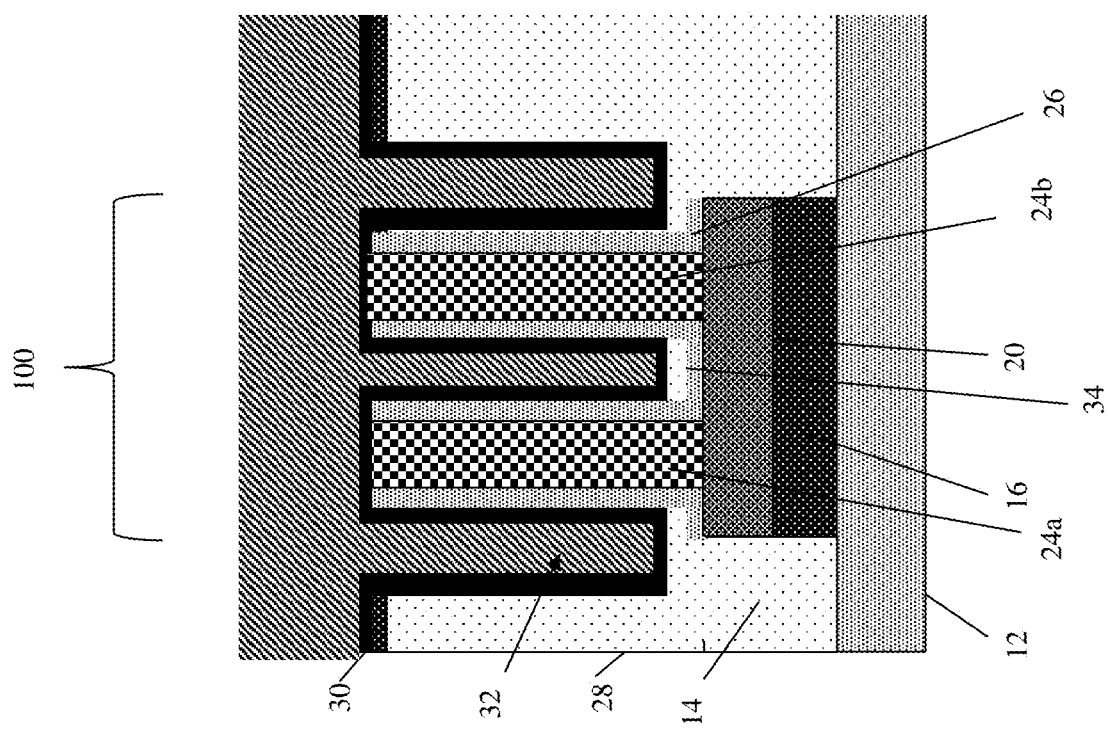

As shown in FIG. 5, a gate dielectric material 36 may line the sidewalls of the gate trenches 32 over the bottom spacer 34, the nanowire material 26 and any further exposed regions, e.g., shallow trench isolation structures 14. The gate dielectric material 36 may be a high-k dielectric material. For example, the gate dielectric material 36 may be a hafnium-based material ($HfO_2$) deposited by conventional deposition processes, e.g., ALD or plasma enhanced CVD processes. A metal gate material 38 may be formed over the gate dielectric material 36, including filling remaining portions of the gate trenches 32. The metal gate material 38 may be tungsten, for example, deposited using conventional deposition processes, e.g., CVD process. In this way, the vertical portion of the nanowire material 26 may be in a channel region of the device, e.g., nFET device or pFET device.

Figure 6:
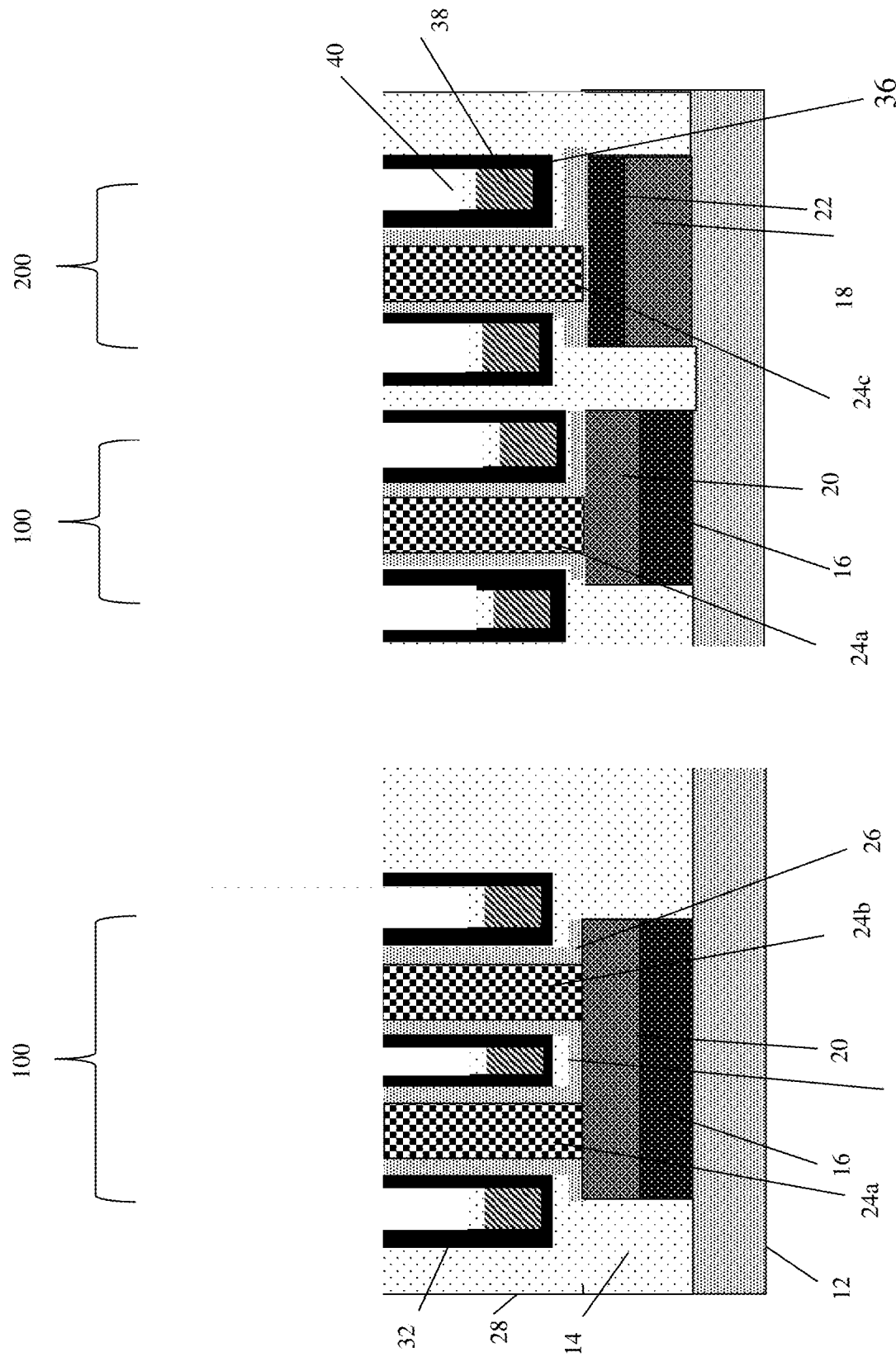
FIG. 6 shows recessed gate material with a top spacer, amongst other features, and respective fabrication processes in accordance with aspects of the present disclosure.

In FIG. 6, the gate dielectric material 36 and metal gate material 38 may be removed from a top surface of the insulator material 28. For example, the gate dielectric material 36 and metal gate material 38 may be removed by a conventional CMP process. The metal gate material 38 may also be recessed within the gate trenches 32, leaving the gate dielectric material 36 on sidewalls of the gate trenches 32. In embodiments, the metal gate material 38 may be recessed to a channel length (Lg) of less than 5 nm, as an example. A top spacer 40 may be formed over the recessed metal gate material 38. The top spacer 40 may be a low-k dielectric material formed by a blanket deposition process, followed by an etch recess as already described herein and as is known in the art.

Figure 7:
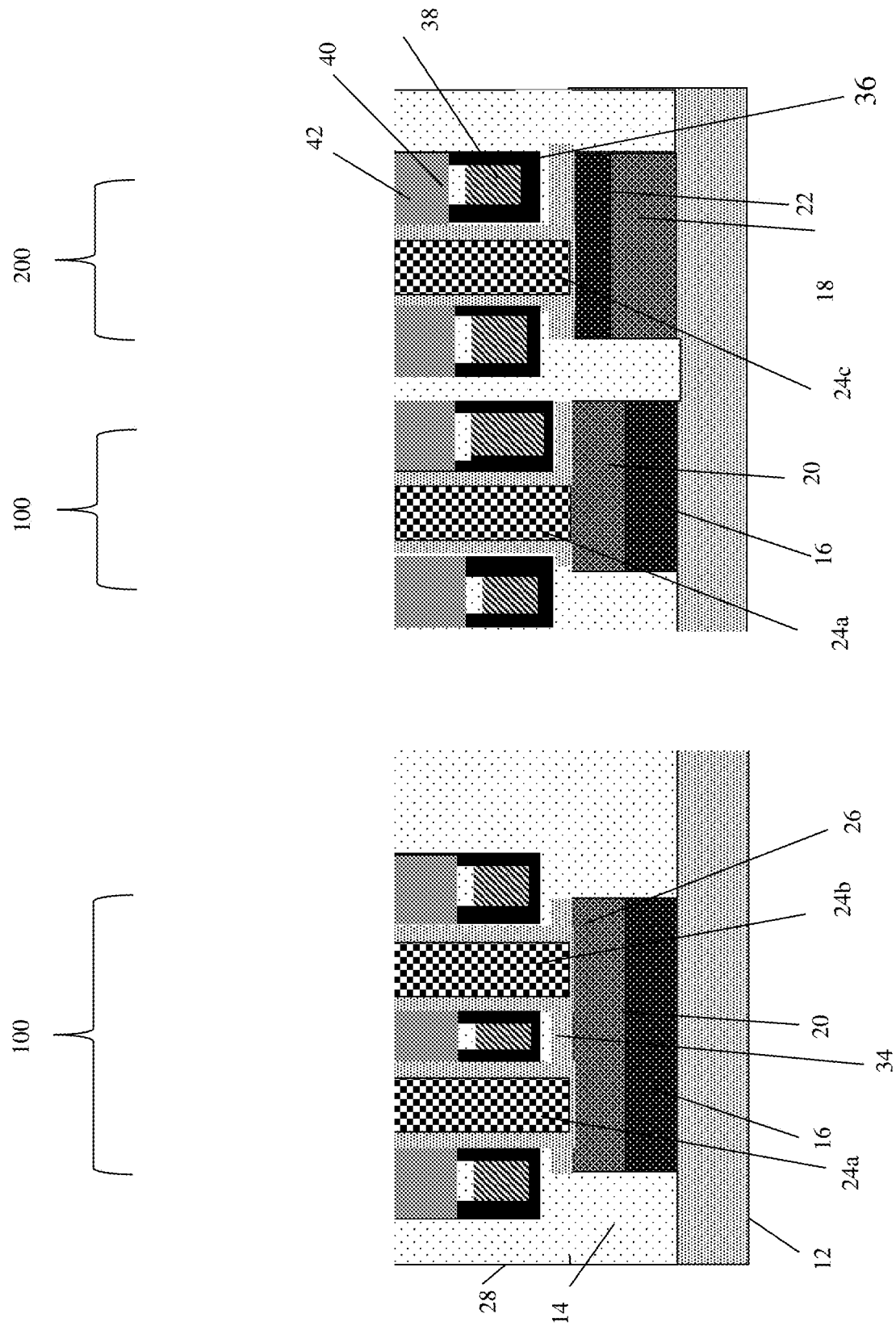
FIG. 7 shows top source/drain regions over the metal gate material and exposed nanowire material, amongst other features, and respective fabrication processes in accordance with aspects of the present disclosure.

In FIG. 7, any exposed gate dielectric material 36 on the sidewalls of the gate trenches 32 may be removed using a selective etching process. In this way, the nanowire material 26 may be exposed on vertical surfaces in PFET region 100 and the NFET region 200. A top source/drain material 42 may be deposited over the metal gate material 38 and exposed nanowire material 26 within the gate trenches 32. In embodiments, the top source/drain material 42 may be polysilicon material deposited by a CVD process, followed by a planarization process, e.g., CMP. The top source/drain material 42 may be P+ doped within the PFET region 100 and N+ doped within the NFET region 200 to form top source/drain regions. The doping may be performed using ion implantation processes as already described herein. The P+ dopant may be boron and the N+ dopant may be arsenic, phosphorous or Sb as examples.

Figure 8:
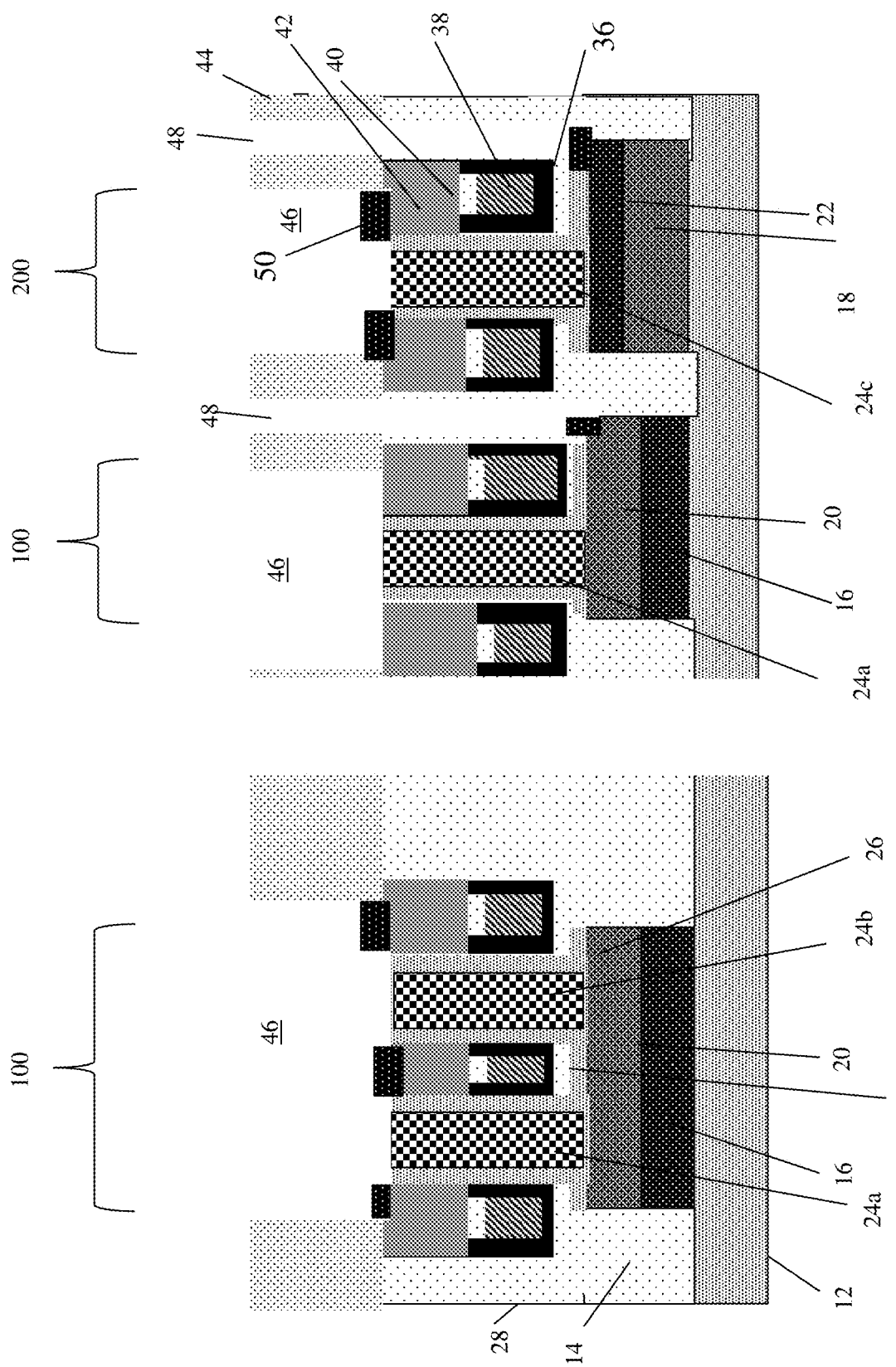
FIG. 8 shows silicide contacts on exposed semiconductor material, amongst other features, and respective fabrication processes in accordance with aspects of the present disclosure.

In FIG. 8, a middle of the line dielectric material 44 may be deposited over the gate material 42 and exposed surfaces of the nanowires (e.g., material 26 surrounding cores 24a, 24b, 24c). In embodiments, the dielectric material 44 may be an oxide material deposited using a CVD process and planarized using a CMP process. Trenches 46 may be formed in the dielectric material 44 to expose top surfaces of the top source/drain material 42; whereas trenches 48 may be formed through the dielectric materials 44, 28 to expose the implant regions 20, 22 (e.g., bottom source/drain regions).

In embodiments, silicide contacts 50 may be formed at a bottom of the trenches 46, 48, e.g., on the exposed semiconductor material. More specifically, the silicide contacts 50 may be formed on the top source/drain regions (material 42) and the bottom source/drain regions (e.g., implants 20, 22). As should be understood by those of skill in the art, the silicide process begins with deposition of a thin transition metal layer, e.g., nickel, cobalt or titanium, over fully formed and patterned semiconductor material (e.g., doped or ion implanted source and drain regions 20, 22, 42). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 50 in the active regions of the device. It should be understood by those of skill in the art that silicide contacts will not be required on the gate metal material.

Figure 9:
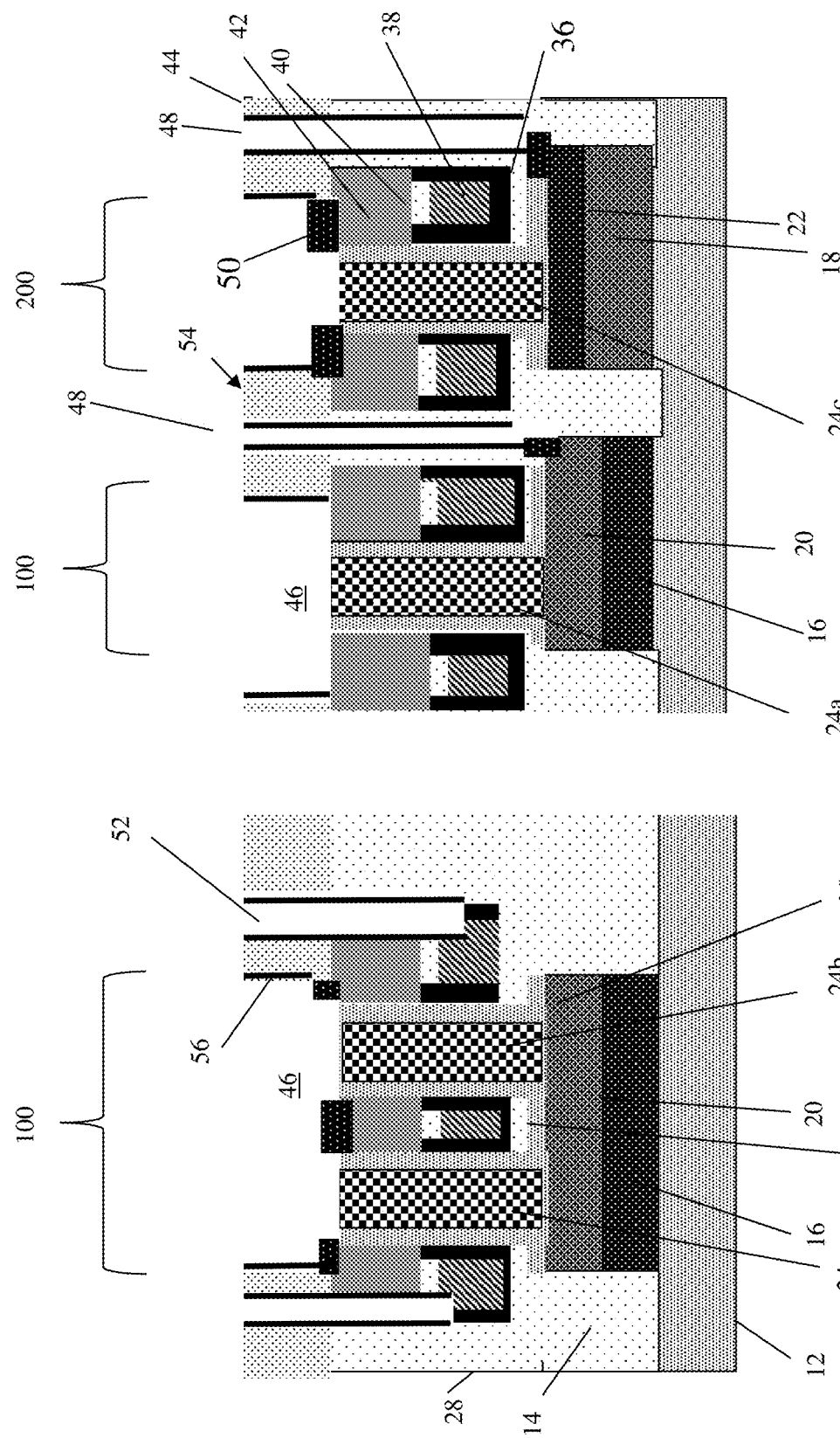
FIG. 9 shows lined contact trenches extending to the gate material, amongst other features, and respective fabrication processes in accordance with aspects of the present disclosure.

As shown in FIG. 9, trenches 52 may be formed through the dielectric materials 44, 28 to expose the gate material 38 in the PFET region 100. The trenches 52 may define pillars or collars 54 composed of the material 42 and dielectric material 44. The sidewalls of the trenches 50, 52 may be lined with spacer material 56, e.g., oxide or nitride. The spacer material 56 may be formed by a blanket deposition process followed by an anisotropic etching process. As should be understood by those of skill in the art, the anisotropic etching process includes a lateral etching component that etches the spacer material on horizontal surfaces. The spacer material 56 will form a collar around subsequently formed contacts.

Figure 10:
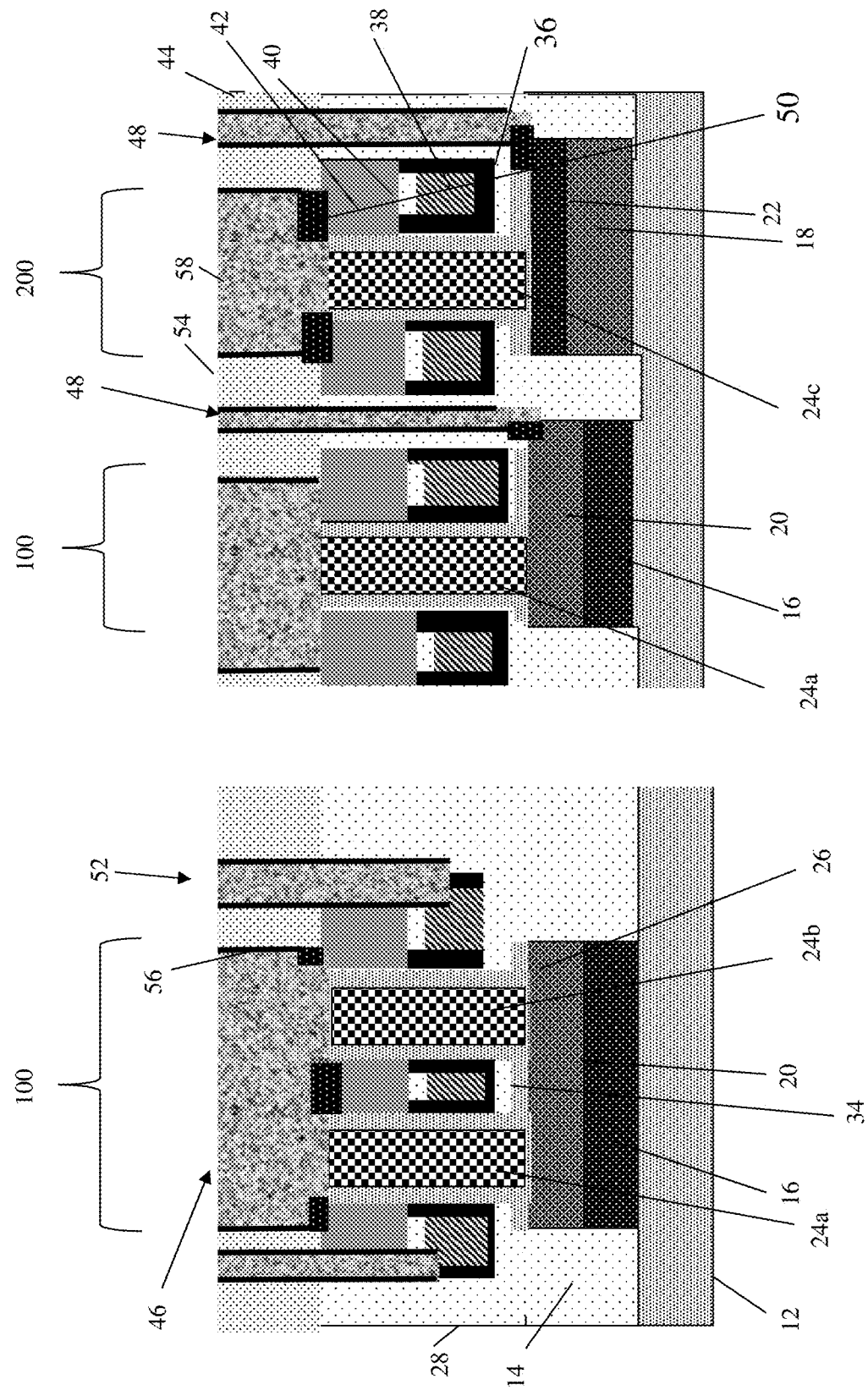
FIG. 10 shows contacts to a gate structure and source/drain regions, amongst other features, and respective fabrication processes in accordance with aspects of the present disclosure.

FIG. 10 shows contacts formation. More specifically, conductive material 58 may be formed in the trenches 46, 48 and 52 to form contacts to the top source/drain regions 42, the bottom implants 20, 22, e.g., bottom source/drain regions, and the gate material 38. The conductive material may be tungsten, which is deposited within the trenches, followed by a CMP process.

The vertical nanowire device can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a bottom source/drain region;
a top source/drain region;
a gate structure extending between the bottom source/drain region and the top source/drain region; and
a vertical nanowire in a channel region of the gate structure,
wherein the gate structure comprises a gate dielectric material contacting the vertical nanowire and a gate metal material and further comprising a bottom spacer located between material of the vertical nanowire and the gate dielectric material.

2. The structure of claim 1, wherein the vertical nanowire comprises a coating of semiconductor material surrounding vertical sidewalls of a core.

3. The structure of claim 2, wherein the core comprises a nitride material.

4. The structure of claim 2, wherein the coating comprises one of $MoS_2$, $HfS_2$, $ZrS_2$, $WS_2$, $WSe_2$, $SnS$, and graphene.

5. The structure of claim 2, wherein the coating comprises a thickness of about 20 Å to about 50 Å.

6. The structure of claim 1, wherein the gate dielectric material comprises a high-k dielectric material contacting the vertical nanowire and the gate metal material.

7. The structure of claim 6, further comprising a top spacer separating the gate metal material and the top source/drain region.

8. The structure of claim 1, wherein a channel length of the gate structure comprises less than about 5 nm.

9. The structure of claim 1, further comprising a first contact that extends to the bottom source/drain region, a second contact that extends to the top source/drain region, and a third contact that extends to gate material of the gate structure.

10. The structure of claim 9, further comprising spacer material surrounding the first contact, the second contact and the third contact.

11. A structure comprising:
a vertical channel region comprising a nanowire;
a first doped region below the vertical channel region;
a second doped region above the vertical channel region;
a gate structure adjacent to the vertical channel region and extending between the first doped region and the second doped region;
a first contact contacting a gate material of the gate structure, and which is isolated from the first doped region by an insulator collar;
a second contact extending to the second doped region, the second contact comprising the insulator collar;
a third contact extending to the first doped region, the third contact comprising the insulator collar; and
a bottom spacer between the nanowire and a dielectric material of the gate structure.

12. The structure of claim 11, wherein the nanowire comprises a vertical nanowire supported by a core of material.

13. The structure of claim 12, wherein the material of the core comprises insulator material.

14. The structure of claim 13, wherein the core and vertical nanowire are above active regions of the gate structure.

15. The structure of claim 12, wherein the vertical nanowire comprises a thickness of less than 5 nm.

16. The structure of claim 12, wherein the vertical nanowire comprises semiconductor material.

17. The structure of claim 12, further comprising a top spacer between the gate material and the second doped region.

18. The structure of claim 17, wherein the gate structure comprises a vertical gate structure comprising a high-k dielectric material and a metal gate material, with the nanowire being a vertical channel region of the gate structure.

19. The structure of claim 11, wherein the nanowire comprises 2-D material.

20. A method comprising:
forming a bottom source/drain region;
forming a top source/drain region;
forming a gate structure extending between the bottom source/drain region and the top source/drain region; and
forming a vertical nanowire in a channel region of the gate structure,
wherein the gate structure comprises a gate dielectric material contacting the vertical nanowire and a gate metal material and further comprising forming a bottom spacer located between material of the vertical nanowire and the gate dielectric material.

\* \* \* \* \*